United States Patent
Mao

(10) Patent No.: US 8,795,538 B2
(45) Date of Patent: Aug. 5, 2014

(54) PROFILE METHOD IN MAGNETIC WRITE HEAD FABRICATION

(75) Inventor: Guomin Mao, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 404 days.

(21) Appl. No.: 13/328,520

(22) Filed: Dec. 16, 2011

(65) Prior Publication Data

US 2013/0157382 A1 Jun. 20, 2013

(51) Int. Cl.
B44C 1/22 (2006.01)

(52) U.S. Cl.
USPC .............................................. 216/22; 216/59

(58) Field of Classification Search
CPC .. G11B 5/3116; G11B 5/3163; G11B 5/1278; G11B 5/1871; H01L 21/31116
USPC ............................. 216/22; 29/603.15, 603.16
See application file for complete search history.

(56) References Cited

U.S. PATENT DOCUMENTS

| 7,563,381 B2 | 7/2009 | Baer et al. |
| 2003/0157803 A1 | 8/2003 | Pinarbasi et al. |
| 2007/0258167 A1 | 11/2007 | Allen et al. |
| 2009/0075181 A1* | 3/2009 | Ha .................................... 430/5 |
| 2009/0236307 A1 | 9/2009 | Okada et al. |
| 2013/0082027 A1 | 4/2013 | Mao |

OTHER PUBLICATIONS

Non-Final Office Action from U.S. Appl. No. 13/251,058 dated May 9, 2013.
U.S. Appl. No. 13/251,058, filed Sep. 30, 2011.

* cited by examiner

Primary Examiner — Roberts Culbert
(74) Attorney, Agent, or Firm — Zilka-Kotab, PC

(57) ABSTRACT

A method according to one embodiment includes depositing a dielectric hard mask layer above a polymer mask underlayer; forming a photoresist mask above the hard mask layer; transferring the image of the photoresist mask onto the hard mask layer using reactive ion etching, thereby defining a hard mask; determining that a critical dimension bias of the hard mask is within or outside a specification; and changing a level of an input source power used during a subsequent reactive ion etching step to move the critical dimension bias towards a target critical dimension bias when the critical dimension bias of the hard mask is outside the specification. Additional embodiments are also disclosed.

20 Claims, 15 Drawing Sheets

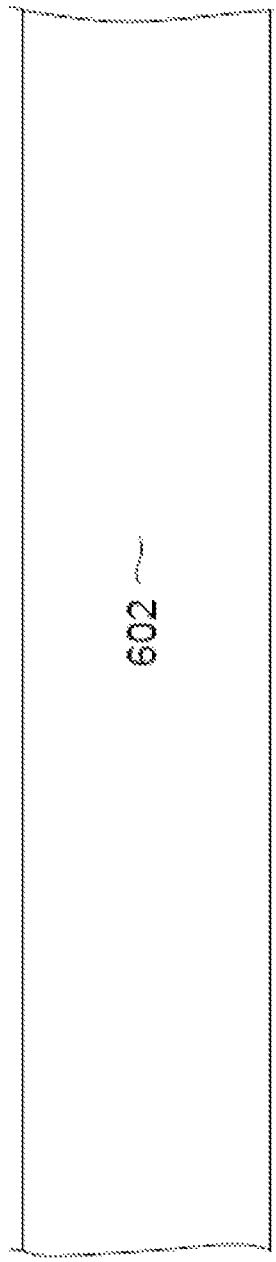

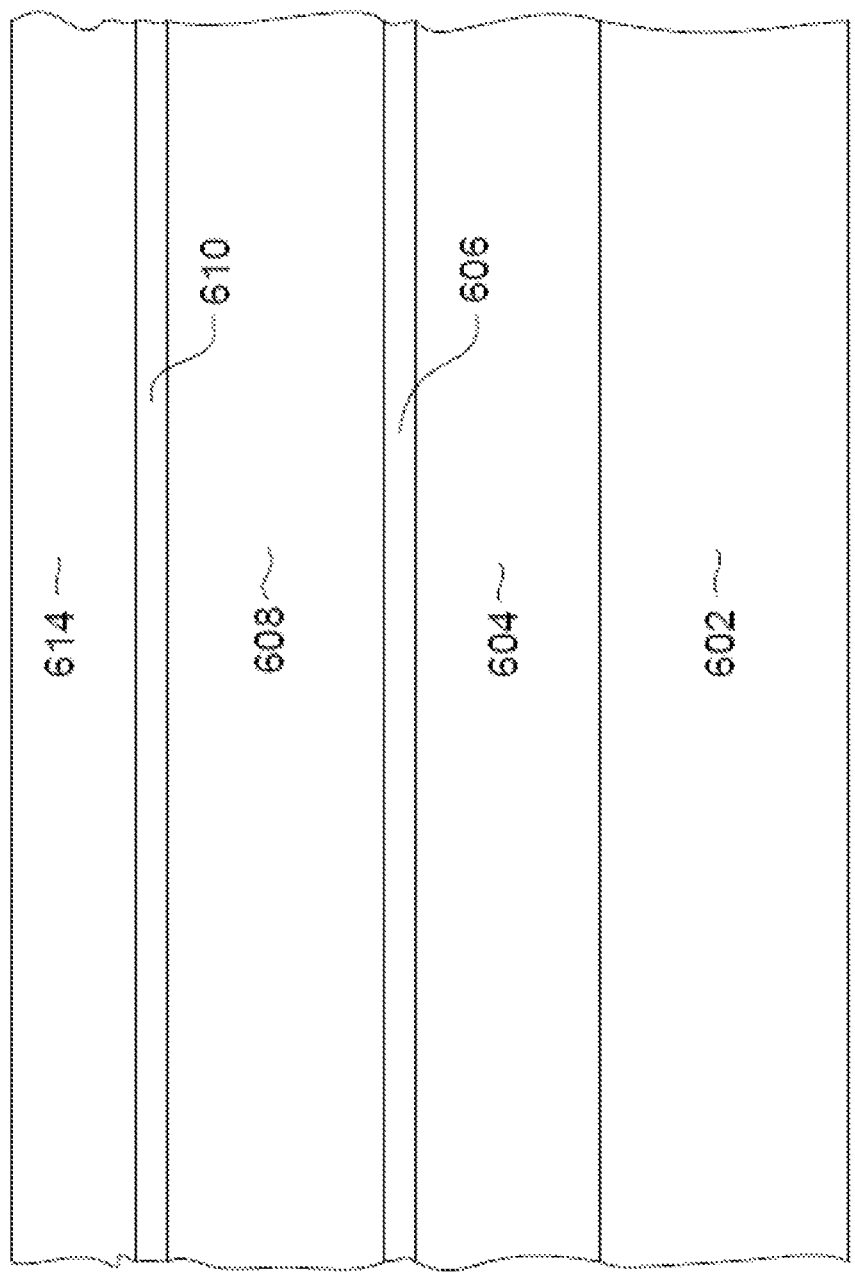

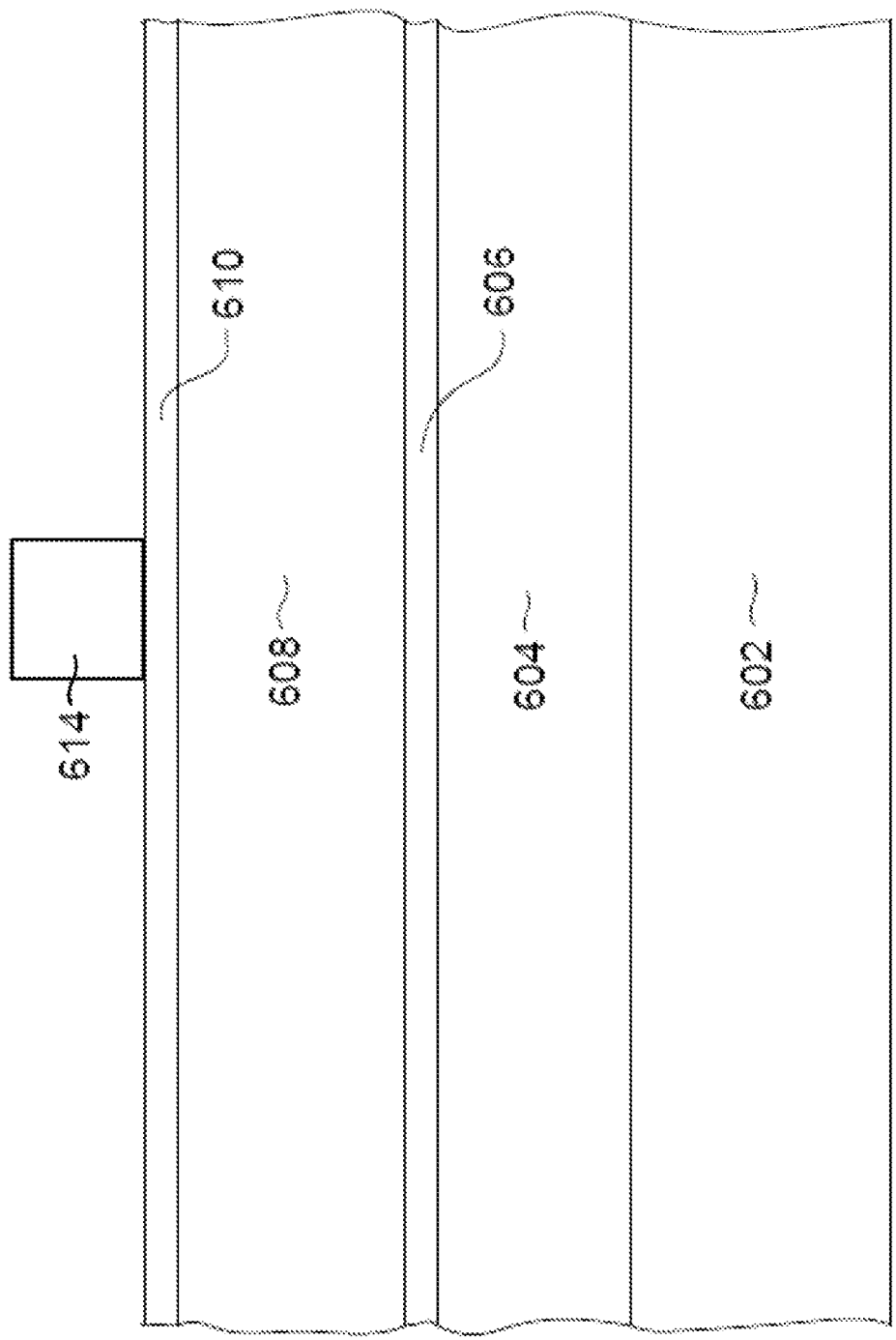

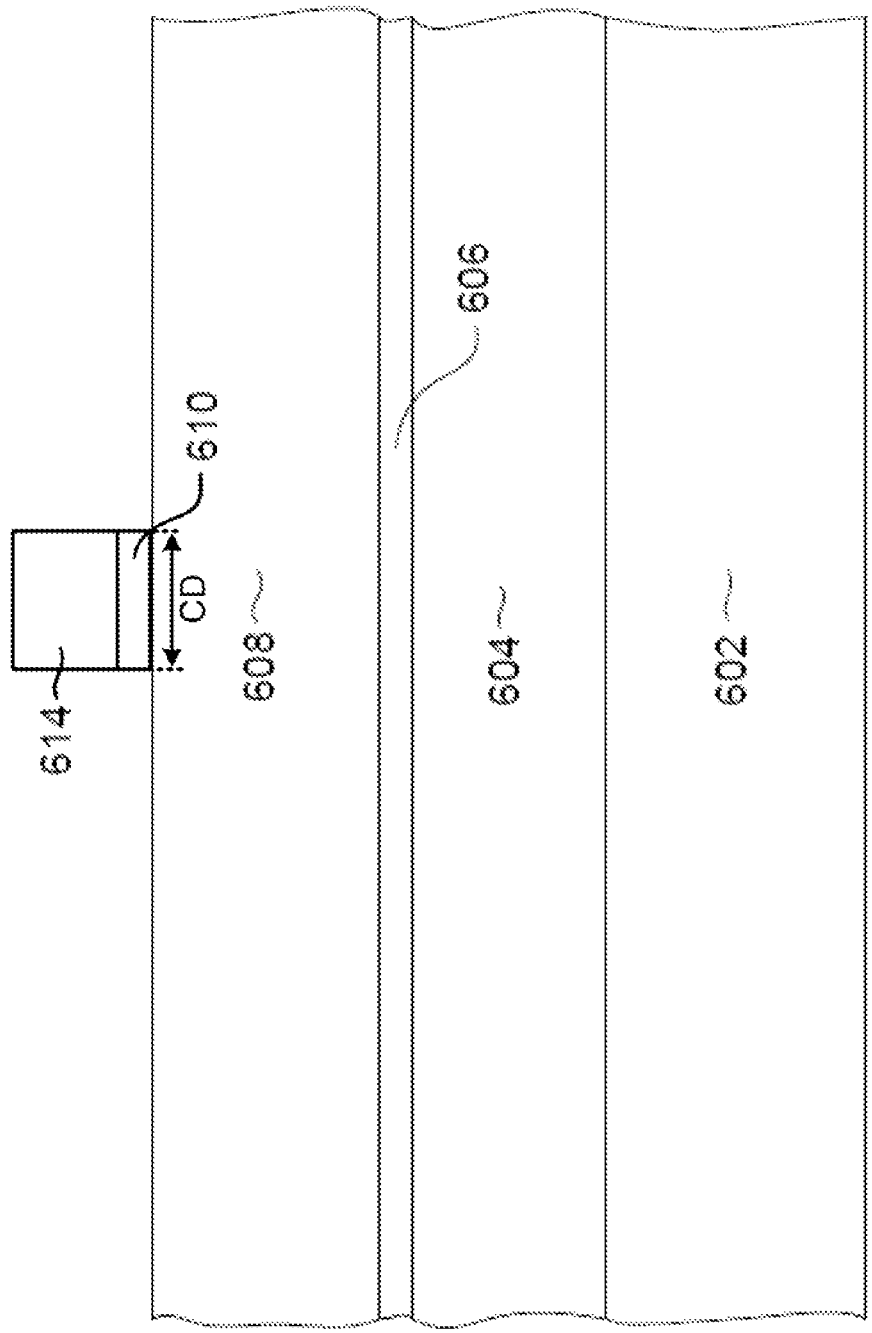

PROFILE METHOD IN MAGNETIC WRITE HEAD FABRICATION

FIELD OF THE INVENTION

The present invention relates to perpendicular magnetic recording and more particularly to a method for manufacturing a magnetic write pole in which an input power is adjusted to achieve a critical dimension (CD) of a hard mask within a specification.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk, and when the disk rotates air adjacent to the disk moves along with the surface of the disk. The slider flies over the surface of the disk on a cushion of this moving air. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

The write head can include a magnetic write pole and a magnetic return pole, the write pole having a much smaller cross section at the ABS than the return pole. The magnetic write pole and return pole are magnetically connected with one another at a region removed from the ABS. An electrically conductive write coil induces a magnetic flux through the write coil. This results in a magnetic write field being emitted toward the adjacent magnetic medium, the write field being substantially perpendicular to the surface of the medium (although it can be canted somewhat, such as by a trailing shield located near the write pole). The magnetic write field locally magnetizes the medium and then travels through the medium and returns to the write head at the location of the return pole where it is sufficiently spread out and weak that it does not erase previously recorded bits of data.

At very small bit sizes it is very important to define the write pole very accurately. As one of the most important processes in magnetic head write fabrication, the hard mask formation and its performance control play critical roles for the subsequent manufacture processes to achieve high production yields. One example is the formation of a Si containing dielectric hard mask which is used as hard mask for the subsequent underlayer mask reactive ion etching (RIE). The dielectric hard mask pattern is formed by transferring a photoresist mask pattern onto a dielectric hard mask layer using a fluorocarbon containing chemistry RIE process which is different from underlayer mask RIE, where an oxygen containing chemistry is used.

Usually, the dielectric hard mask layer is much thinner than the under-layer mask. This is acceptable because of the high selectivity of the dielectric hard mask to underlayer in oxygen RIE. However, processes used to manufacture the write pole by defining a mask structure typically result in the underlayer mask structure being poorly defined, with rough sidewalls, irregular undercuts and other deformities. This makes an accurate definition of the write pole difficult to achieve.

SUMMARY OF THE INVENTION

A method according to one embodiment includes depositing a dielectric hard mask layer above a polymer mask under-layer; forming a photoresist mask above the hard mask layer; transferring the image of the photoresist mask onto the hard mask layer using reactive ion etching, thereby defining a hard mask; determining that a critical dimension bias of the hard mask is within or outside a specification; and changing a level of an input source power used during a subsequent reactive ion etching step to move the critical dimension bias towards a target critical dimension bias when the critical dimension bias of the hard mask is outside the specification.

A method for manufacturing a magnetic write head according to one embodiment includes providing a wafer; depositing a magnetic write pole material on the wafer; depositing an etch stop layer above the magnetic write pole material; depositing a polymer mask under-layer above the etch stop layer; depositing a dielectric hard mask layer above the under-layer; forming a photoresist mask over the dielectric hard mask layer; transferring the image of the photoresist mask onto the hard mask layer using reactive ion etching, thereby defining a hard mask; determining that a critical dimension bias of the hard mask is within or outside a specification; performing subsequent processing on the wafer when the critical dimension bias of the hard mask is within the specification; and removing the hard mask when the critical dimension bias of the hard mask is outside the specification and repeating the forming the photoresist mask and the transferring using a different level of an input source power for the reactive ion etching, the different level being selected based on the determining.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

FIGS. 6A-6G are partial cross sectional views of a portion of a write head in various intermediate stages of manufacture, illustrating a method of manufacturing a magnetic write head according to an embodiment of the invention.

DETAILED DESCRIPTION OF THE EMBODIMENTS

The following description is of the best embodiments presently contemplated for carrying out this invention. This description is made for the purpose of illustrating the general principles of this invention and is not meant to limit the inventive concepts claimed herein.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

A method according to one embodiment includes depositing a dielectric hard mask layer above a polymer mask under-layer; forming a photoresist mask above the hard mask layer; transferring the image of the photoresist mask onto the hard mask layer using reactive ion etching, thereby defining a hard mask; determining that a critical dimension bias of the hard mask is within or outside a specification; and changing a level of an input source power used during a subsequent reactive ion etching step to move the critical dimension bias towards a target critical dimension bias when the critical dimension bias of the hard mask is outside the specification.

A method for manufacturing a magnetic write head according to one embodiment includes providing a wafer; depositing a magnetic write pole material on the wafer; depositing an etch stop layer above the magnetic write pole material; depositing a polymer mask under-layer above the etch stop layer; depositing a dielectric hard mask layer above the under-layer; forming a photoresist mask over the dielectric hard mask layer; transferring the image of the photoresist mask onto the hard mask layer using reactive ion etching, thereby defining a hard mask; determining that a critical dimension bias of the hard mask is within or outside a specification; performing subsequent processing on the wafer when the critical dimension bias of the hard mask is within the specification; and removing the hard mask when the critical dimension bias of the hard mask is outside the specification and repeating the forming the photoresist mask and the transferring using a different level of an input source power for the reactive ion etching, the different level being selected based on the determining.

Figure 1:
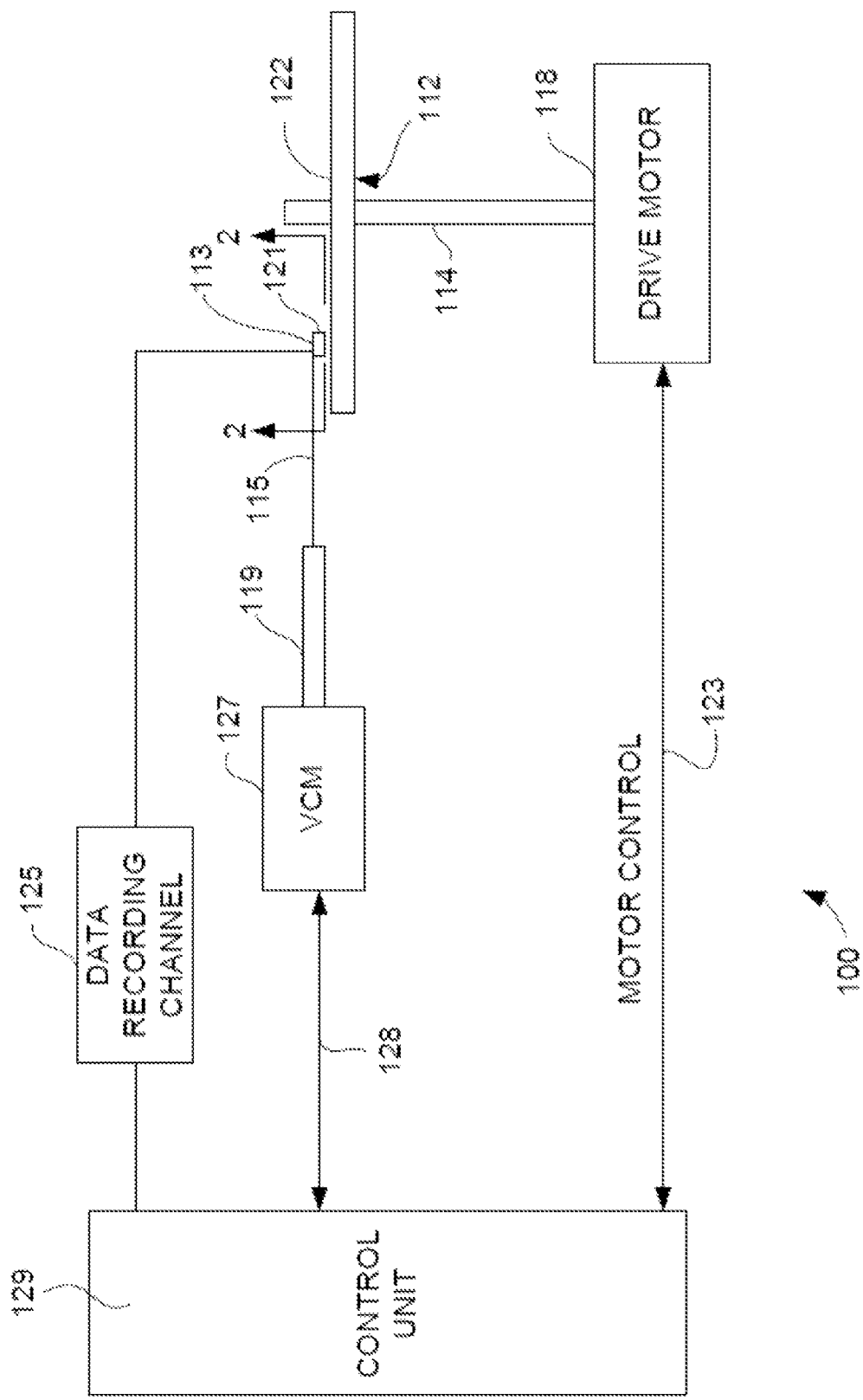
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator 127. The actuator 127 as shown in FIG. 1 may be a voice coil motor (VCM). The VCM includes a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 includes logic control circuits, storage and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
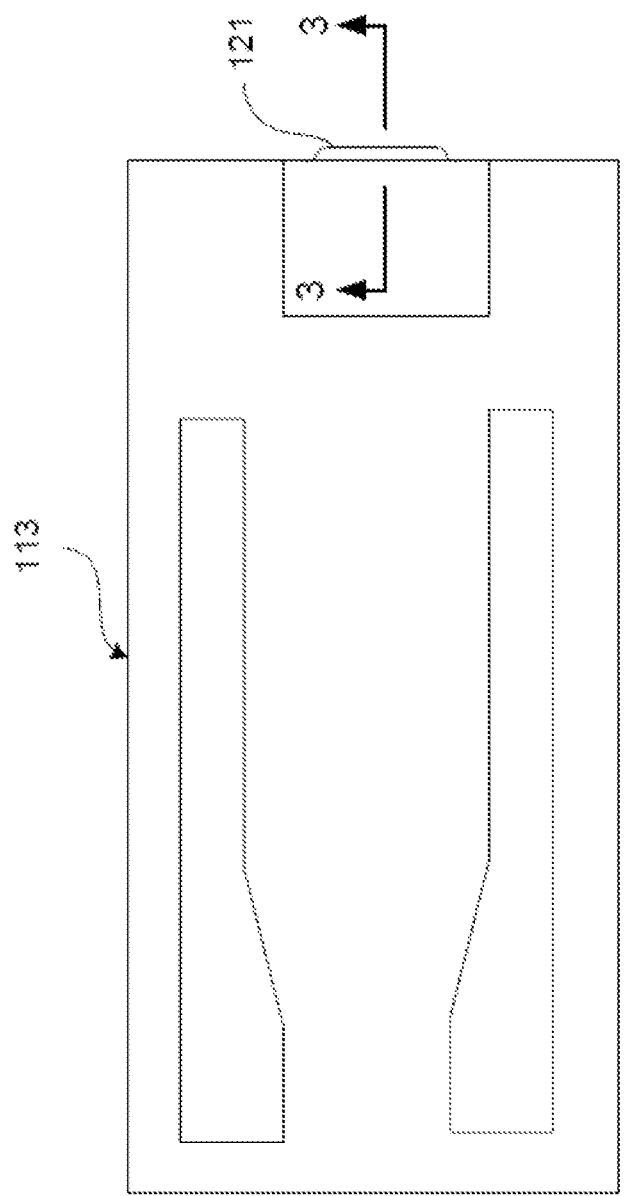
FIG. 2 is an ABS view of a slider, taken from line 2-2 of FIG. 1, illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
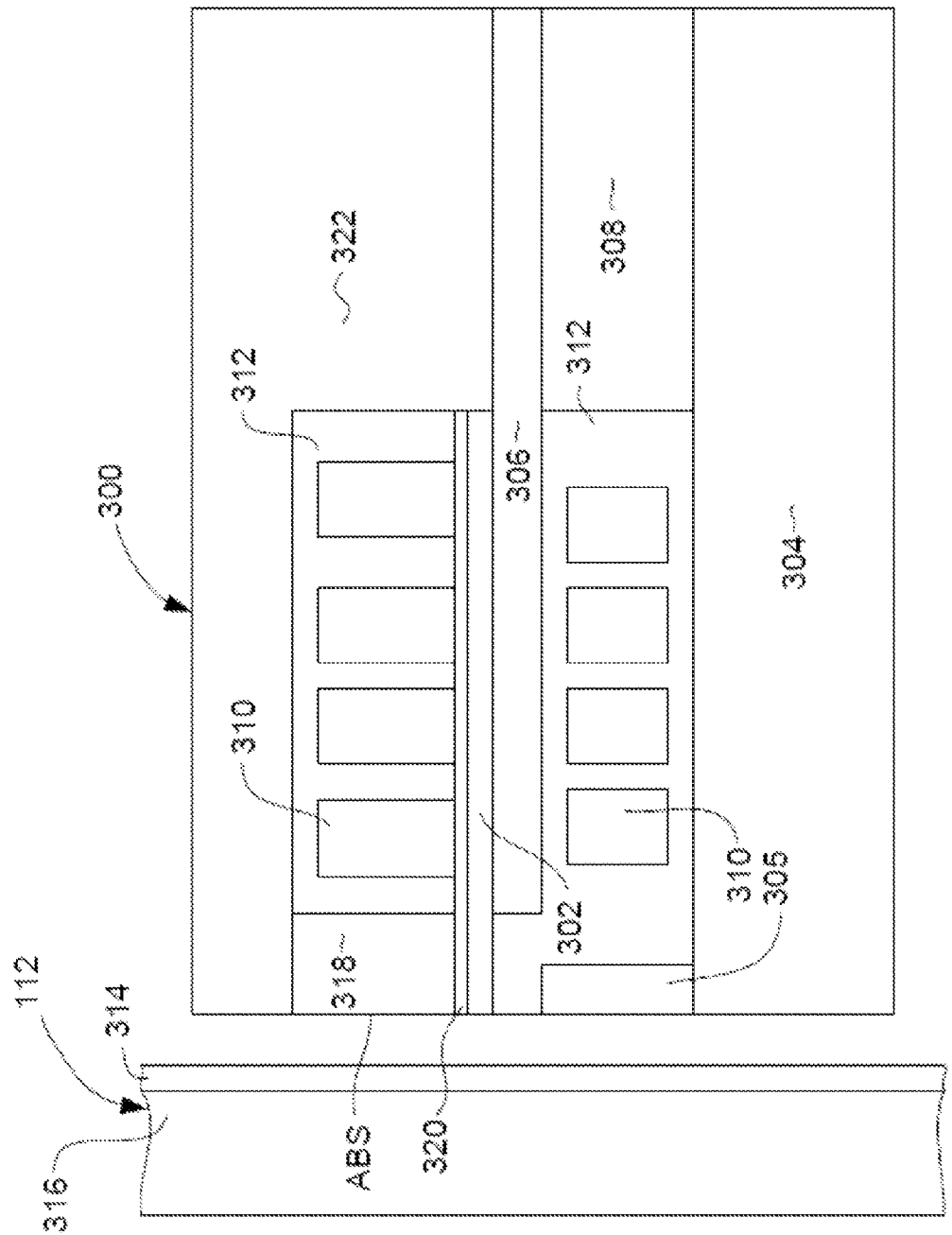
FIG. 3 is a cross sectional view of a magnetic head, taken from line 3-3 of FIG. 2 and rotated 90 degrees counterclockwise, of a magnetic head according to an embodiment of the present invention.

FIG. 3 is a side cross sectional view of a magnetic write head 300 that can be constructed by a method of the present invention. The write head 300 includes a magnetic write pole 302 and a magnetic return pole 304. The magnetic write pole 302 can be connected with a magnetic shaping layer 306 that helps to conduct magnetic flux to the tip of the write pole 302. The write pole 302 and shaping layer 306 can be connected with the magnetic return pole 304 by a magnetic back gap structure 308. A non-magnetic, electrically conductive write coil 310 passes between the return pole 304 and the write pole and shaping layer 302, 306, and may also pass above the write pole and shaping layer 302, 306. The write coil 310 can be encased in a non-magnetic, electrically insulating material 312, which can be a material such as alumina and/or hard baked photoresist. When an electrical current flows through the write coil 310 a magnetic field is induced around the coil 310 that results in a magnetic flux flowing through the return pole 304, back gap layer 308, shaping layer 306 and write pole 302. This results in a write field being emitted from the tip of the write pole 302. This strong, highly concentrated write field locally magnetizes a magnetic top layer 314 of the magnetic media 112. The magnetic field then travels through a soft magnetic under-layer 316 of the magnetic media before returning to the return pole 304, where it is sufficiently spread out and weak that it does not erase the previously recorded bit of data. The write head 300 can also include a magnetic pedestal 305, at the ABS that acts as a shield to prevent stray fields, such as those from the write coil 310 from reaching the magnetic medium 112.

The write head 300 may also include a trailing magnetic shield 318, located at the ABS and separated from the write pole 302 by a non-magnetic trailing gap layer 320. The trailing magnetic shield 318 can be connected with the other magnetic structures at the back of the write head 300 by a trailing magnetic pole 322.

Figure 4:
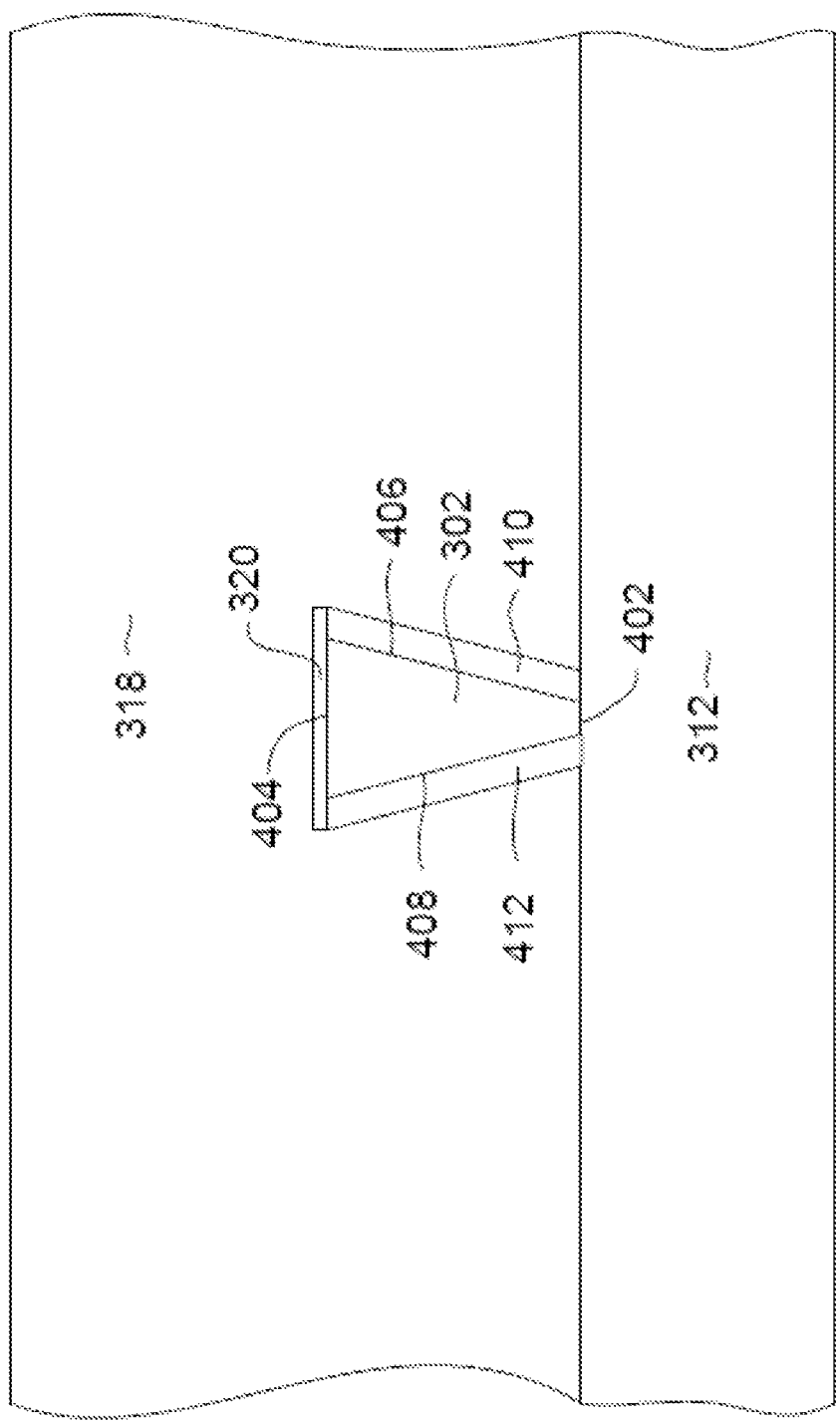
FIG. 4 is an enlarged ABS view of a portion of the write head of FIG. 3.

FIG. 4 is an ABS view of a portion of the magnetic write head 300 of FIG. 3. The view in FIG. 4 is enlarged to more clearly show the write pole 302. In FIG. 4 it can be seen that the write pole 302 has a trapezoidal shape, having a leading edge 402, and a trailing edge 404 and first and second laterally opposed sides 406, 408 that each extend from the leading edge 402 to the trailing edge 404. The leading edge is preferably narrower than the trailing edge, and in many cases, the leading edge is so narrow that its width is virtually zero that the ABS becomes a triangle shape. This shape helps to reduce skew related adjacent track interference when the head is at an extreme inner or outer radial location over the media 112 (as seen in FIG. 1). Also as can be seen, the trailing magnetic shield 318 can extend down the sides of the write pole 302 to provide a side shielding function to prevent stray fields from reaching and affecting the magnetic media. The side portions of the shield 318 are separated from the sides 406, 408 of the write pole 302 by non-magnetic side gap layers 410, 412.

Figure 5:
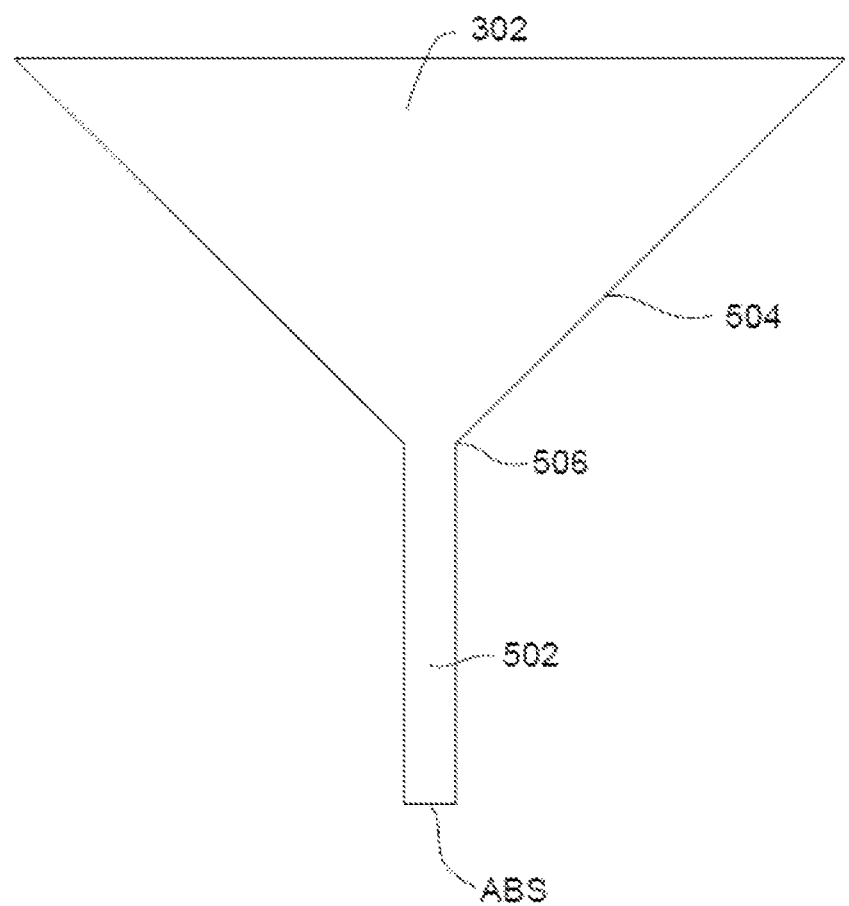
FIG. 5 is a top down view of a write pole of the write head of FIG. 4.

FIG. 5 shows a top down view of the write pole 302. As can be seen in FIG. 5, the write pole 302 has a narrow pole tip portion 502 that can be formed with a relatively constant cross section, and a flared portion 504. The junction between the constant cross section pole tip portion 502 and the flared portion 504 defines a flare point 506. The location of this flare point relative to the ABS is an important parameter to the performance of the write head 302.

A well-defined milling mask is critical to the proper definition of the write pole. As mentioned above, prior processes used to manufacture the write pole by defining a mask structure typically result in the underlayer mask structure being poorly defined, with rough sidewalls, irregular undercuts and other deformities. This makes an accurate definition of the write pole difficult to achieve. Accordingly, for proper write pole definition, excellent control on both CD and side wall profile of the underlayer mask is critical. The following procedure describes a method for forming a write pole, the method having providing excellent control on both CD and side wall profile of the underlayer mask by enabling proper definition of the overlying hard mask.

Figure 6B:
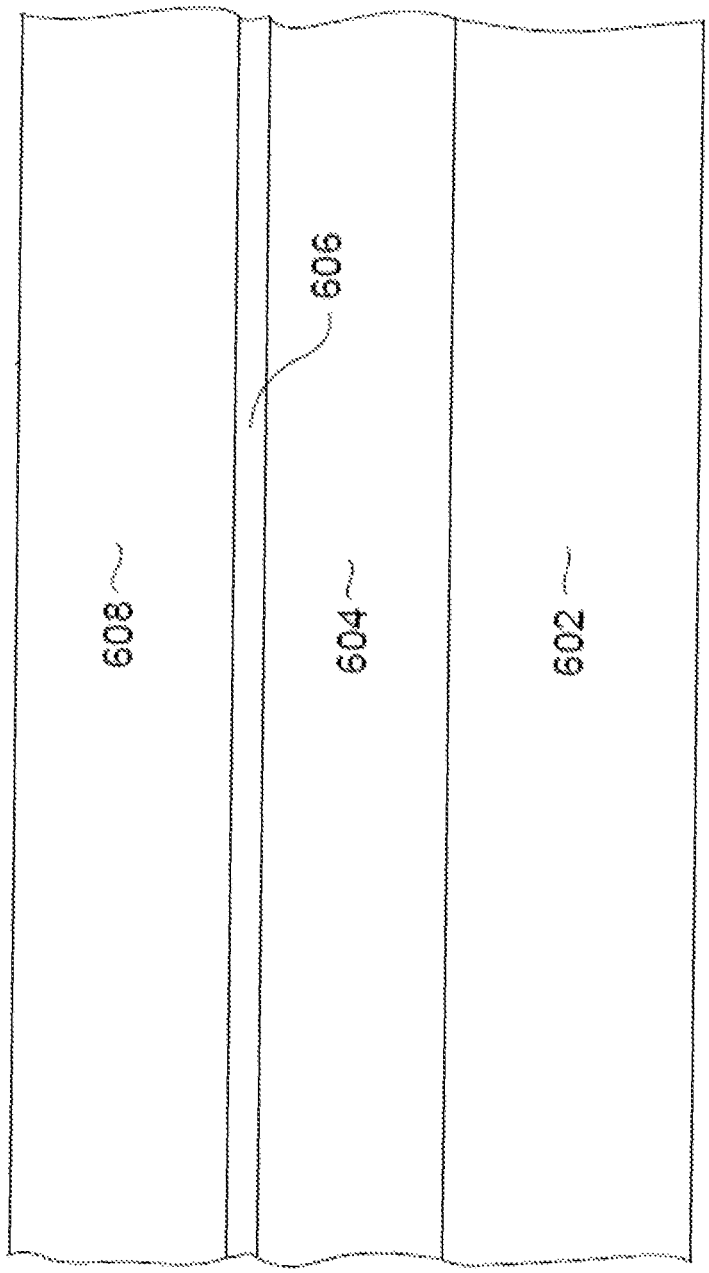

FIGS. 6A-6G show a write pole in various intermediate stages of manufacture in order to illustrate a method of manufacturing a magnetic write head according to an embodiment of the invention. With particular reference to FIG. 6A, a substrate 602 is provided. The substrate can include a portion of the non-magnetic material 312 of FIG. 3 and at least a portion of the shaping layer 306 of FIG. 3, or may be any other substrate which would be apparent to one skilled in the art upon reading the present description.

Now referring to FIG. 6B, a write pole layer 604 is formed above the substrate 602. In a preferred approach, the substrate write pole layer 604 has a multilayer structure, but may have any other configuration which would be apparent to one skilled in the art upon reading the present description. In one approach, a magnetic laminate structure may be optionally deposited above the substrate 602. In various approaches, the magnetic laminate structure may include layers of magnetic material such as CoFe separated from one another by thin layers of non-magnetic material. For purposes of simplicity, the optional laminated structure is shown as a single layer 604 in FIG. 6B.

With continued reference to FIG. 6B, an optional etch stop layer 606 may be formed above the write pole layer 604. The etch stop layer 606 may be constructed of a material such as alumina ($Al_2O_3$), Ta, silicon oxide ($SiO_2$) and laminate layers of Diamond Like Carbon (DLC) or carbon with alumina, Ta and $SiO_2$ etc. or any other material which would be apparent to one skilled in the art upon reading the present description.

A polymer mask under-layer 608 is deposited above the write pole layer 604, or etch stop layer 606 if present. In a preferred approach, the under-layer 608 may include a polymeric material, which may or may not be comprised of laminated layers. Preferably, the polymeric material can be cured at a relatively low temperature, such as around 150 to 250 degrees C. Examples of such polymeric materials include, but are not limited to SIUL® (Shin-Etsu Chemical Co., Ltd.), DURIMIDE® (Fujifilm Corporation), JSR HM8006® (Honeywell International Inc.), ACCUFLO T-31® (Honeywell International Inc.), etc. or any other material which would be apparent to one skilled in the art upon reading the present description.

This under-layer 608 (which also can be referred to as an image transfer layer) provides masking during an ion milling process that will be described herein below. In various approaches, the thickness of the under-layer 608 may depend upon the duration and strength of the ion milling that will be performed to define the write pole. In an illustrative embodiment however, the under-layer 608 may range from about a few hundred nanometers to more than about two thousand nanometers, but may be more or less depending on the desired design.

Figure 6C:
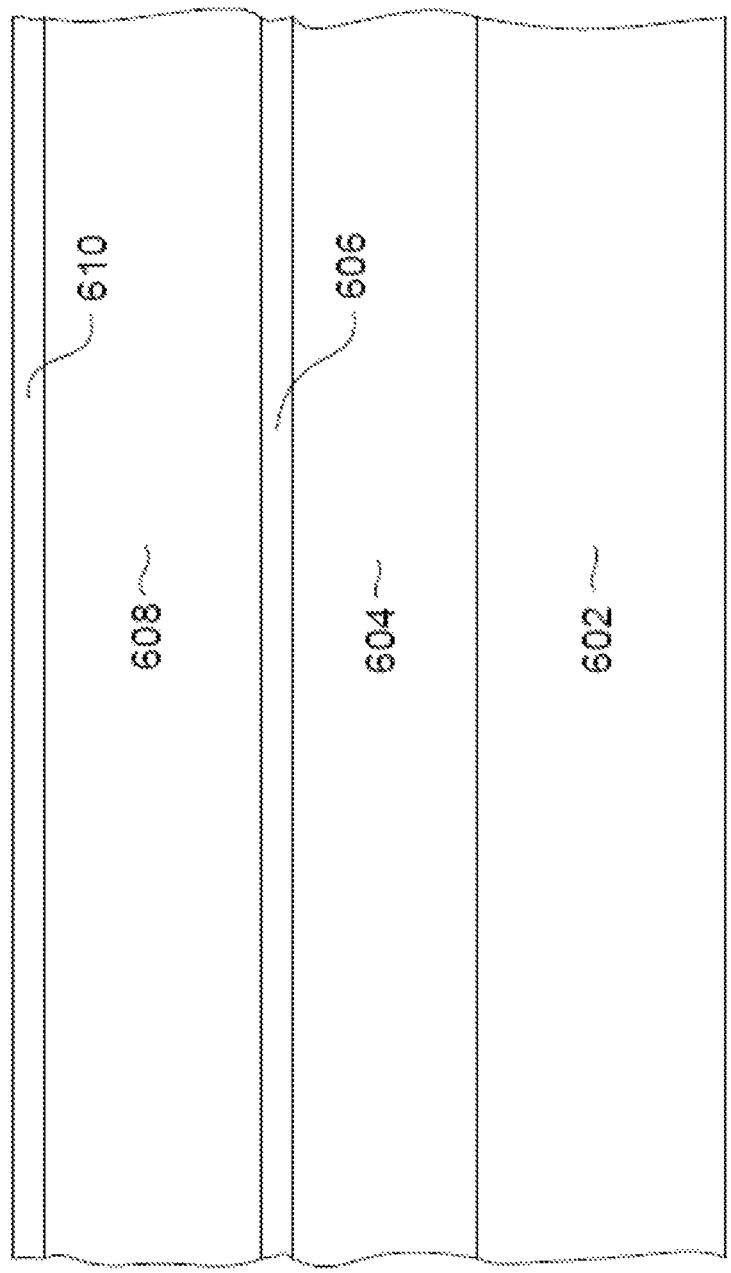

Referring to FIG. 6C, a dielectric hard mask layer 610 is deposited over the polymer mask under-layer 608. The dielectric hard mask layer 610 may be constructed of a dielectric material and is preferably constructed of a Si containing hard mask material such as silicon oxide, silicon nitride, silicon oxynitride or a silicon containing organic material such as SIHM® (Shin-Etsu Chemical Co., Ltd.), UVAS (Honeywell International Inc.), etc. In various approaches, the thickness of the dielectric hard mask layer 610 may depend on the thickness of the underlayer 608. Generally, the thicker the under-layer 608, the thicker the dielectric hard mask layer 610 will preferably be.

In one embodiment, an optional Bottom Anti-Reflective Coating (BARC) may be applied above the dielectric hard mask layer 610. The determination of whether a BARC layer is desirable depends on the requirements of the photolithograph and on the material used for the dielectric hard mask layer 610. For example, if the dielectric hard mask layer 610 itself is a material that acts as a BARC, then no BARC layer is desired. Such materials include silicon oxynitride, SIHM (Shin-Etsu Chemical Co., Ltd.), UVAS (Honeywell International Inc.), etc. Also, no BARC is desired if the dielectric hard mask layer 610 is sufficiently thin and the critical dimensions (CDs) of the magnetic pole are large enough that the under-layer 608 can function as a BARC. However, some form of BARC is desirable to control photolithography parameters such as reflective swing and photo CDs.

Now referring to FIG. 6D, a photoresist layer 614 is formed above the dielectric hard mask layer 610. In various approaches, the photoresist layer 614 may be any material which would be apparent to one skilled in the art upon reading the present description. The thickness of the photoresist layer 614 may preferably be thick enough to effectively mask the dielectric hard mask 610 and/or the optional BARC when transferring the image of the photoresist mask 614 onto the dielectric hard mask layer 610 (as will be described below), but may be thicker or thinner based on the desired embodiment. The photoresist layer 614 is photolithographically patterned to define a write pole-defining photoresist mask, resulting in a structure as shown in FIG. 6E.

Referring now to FIG. 6F, the image of the photoresist mask 614 is transferred onto the dielectric hard mask layer 610 using an appropriate Reactive Ion Etching (RIE). In one approach, the RIE may remove portions of the dielectric hard mask 610 that are not protected by the photoresist mask 614, leaving a structure as shown in FIG. 6F. In one approach, this RIE may be a first RIE which may preferably be performed in a fluorine containing plasma chemistry such as one that contains $CF_4$, $CHF_3$, Ar, He etc., a combination of these, or any other compound which would be apparent to one skilled in the art upon reading the present description. According to an illustrative approach, a first RIE may additionally include transferring the image of the photoresist mask 614 onto the under-lying dielectric hard mask layer by removing portions of the dielectric hard mask layer 610 that are not protected by the photoresist mask 614, leaving a structure as shown in FIG. 6F.

While any suitable tool known in the art may be used, one plasma tool especially suitable for the RIE process to etch the dielectric hard mask material and polymer mask under-layer is Plasma-Therm's® VERSALOCK® etcher, which is an inductively coupled plasma (ICP) etch system in which the plasma is generated by means of inductively coupling 2 MHz RF power (the source power) while independently controlling the ion energy directed toward the substrate via 13.56 MHz bias power. This separate power control allows a wider range of RIE processes to be performed, ranging from highly chemical processes to highly physical processes. The VERSALOCK® etcher is equipped with an Optical Emission Spectrometry (OES) endpoint system that allows precise control of the over-etch amount via the determination of etch endpoint.

Many other ICP etchers equipped with both source and bias power supplies, such as TCP9400DFM® from Lam Research Inc.®, or DPS® from Applied Materials Inc.®, can also be used for the RIE dielectric hard mask material and polymer mask under-layer. It is expected that the RIE process presented herein can be used in conjunction with many different ICP etchers.

The exposed dielectric hard mask 610 (FIG. 6F) is removed by the RIE plasma comprising a mixed gas of $CF_4$, $CHF_3$ and He. It is preferable that both $CF_4$ and $CHF_3$ gas flow is in the range of 5 to 50 sccm, and the He gas flow is no more than 30 sccm.

As discussed in more detail below, the CD of the hard mask, defined as the width of the bottom of the hard mask as shown in FIG. 6F, is highly determinative of whether the under-layer 608 will be properly defined or not upon patterning thereof. Consequently, if the under-layer 608 is not properly patterned, the write pole will not be properly defined.

Figure 6G:
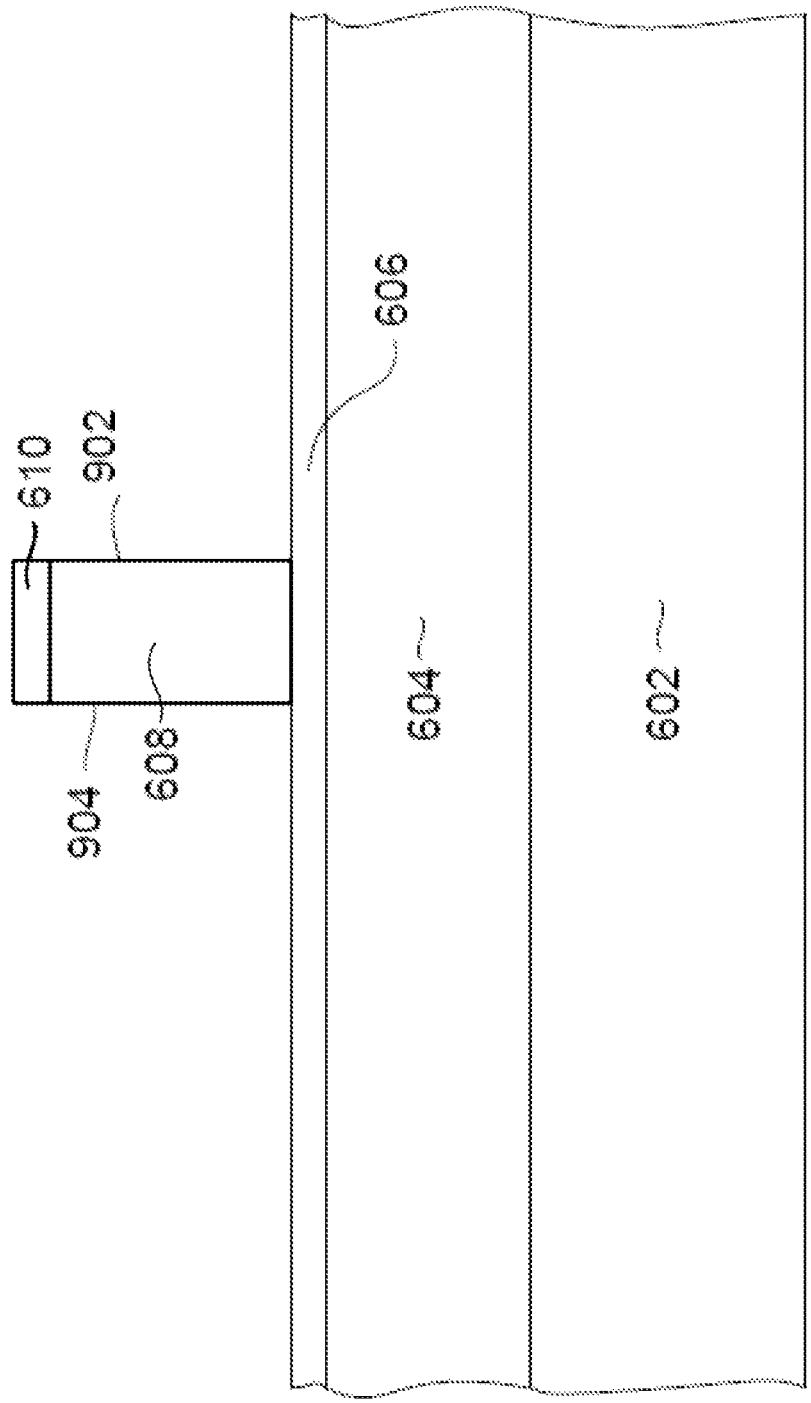

Referring to FIG. 6G, and as described in more detail below, the image of the hard mask 610 may be transferred onto the underlayer 608 using a second RIE which may have a different material selectivity than the first RIE, after determining that the CD width of the hard mask is within the specification (as will be described below). In one approach, the second RIE is an oxygen RIE. An illustrative second RIE process is described in U.S. patent application Ser. No. 13/251,058 entitled "Method For Manufacturing A Perpendicular Magnetic Write Head Using Novel Reactive Ion Etching Chemistry," filed Sep. 30, 2011, which is herein incorporated by reference.

Figure 7:
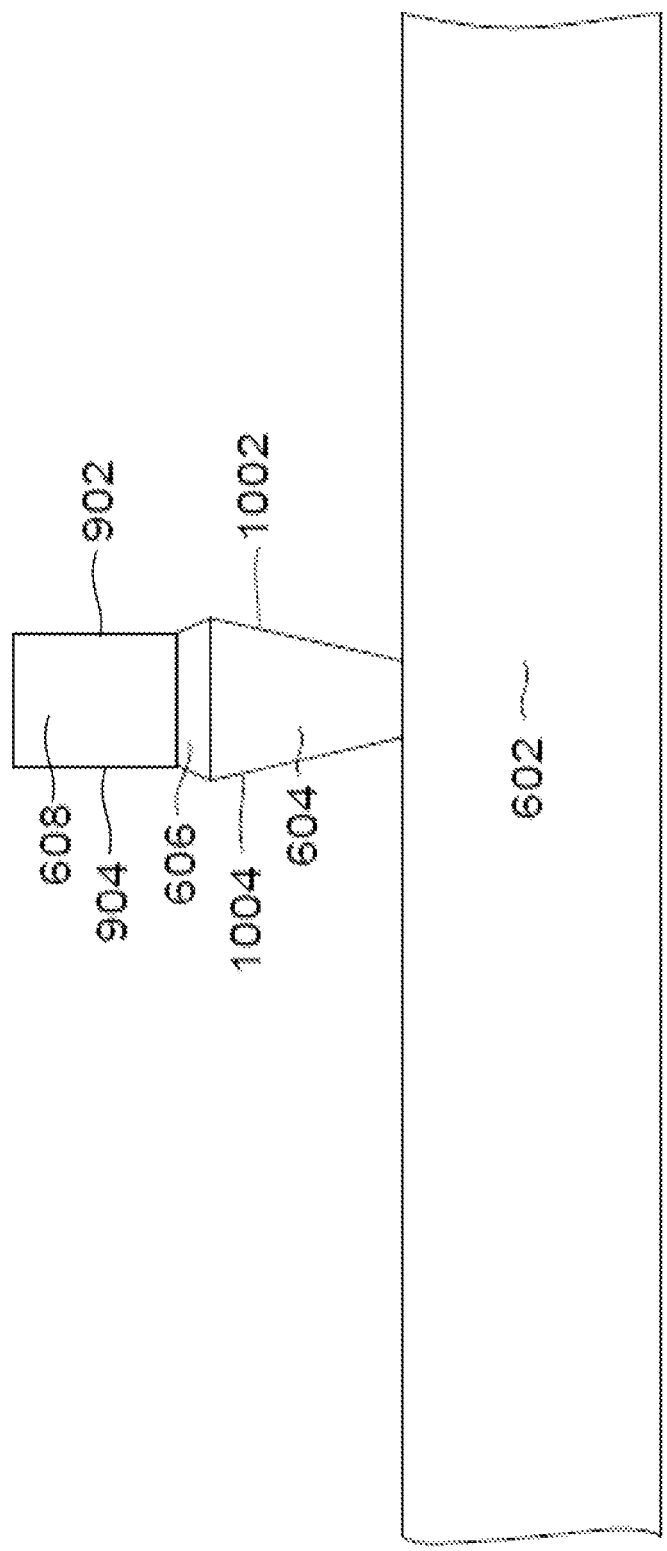
FIG. 7 is a cross sectional view of a portion of a write head in a particular intermediate stage of manufacture according to one embodiment.

After under-layer 608 has been patterned as described above, an ion milling may be performed to transfer the image of the under-layer 608 onto the magnetic write pole material 604, thereby defining a magnetic write pole, as shown in FIG. 7. In one approach, the ion milling may include a sweeping ion milling. In one approach, the ion milling removes the remaining dielectric hard mask 610 and also consumes a portion of the under-layer 608, so the under-layer 608 is shorter after ion milling than before.

As can be seen in FIG. 7, the patterned under-layer 608 defines the shape of the final, formed write pole 604. Therefore, it is important that the shape of the under-layer 608 be very well defined, and especially that the sides 902, 904 are well defined as vertical and within the CD specifications.

In practice, it has been found that, for dielectric hard masks with thinner dimensions such as less than about 300 nm, the cross-sectional side wall profiles of the dielectric hard mask can be approximated as having three basic geometric shapes, depending on the RIE parameters such as the gas chemistry, chamber pressure, RF power, etc. In a preferred process window, the side wall profile of the dielectric hard mask can be formed as substantially vertical and straight, previously described as being preferable. One of the basic preferences to be a good hard mask is that its side wall profile is preferably shaped as vertical and straight as possible. With the substantially vertical and straight dielectric hard mask, an under-layer mask can be defined to possess the same desired characteristic by the under-layer RIE process.

However, an undesirable process window may occur where the formed side wall profile of the hard mask may not be vertical enough, caused by either having an undercut shape where the bottom CD of the dielectric hard mask is smaller than its top CD; or a taper shape where the bottom CD is greater than its top CD. Since these side wall profiles are not vertical, the dielectric hard mask may lose its masking function during the subsequent under-layer RIE process. This is in part due to the high likelihood of thinner tip portions at the intersection of the sidewalls and the top or bottom of the hard masks being consumed disproportionally with the rest of the hard mask, the final shape of the under-layer mask pole may not be vertical, and may even vary a great deal from top to bottom. This in turn affects the CD of the under-layer mask. For example, during the initial under-layer mask RIE of one embodiment, the top portion of the under-layer mask may be formed with a desirable CD while the bottom CD is much smaller. This causes the already formed top portion of the under-layer mask structure to be directly exposed to RIE plasma, causing it to erode during the remaining RIE process, resulting in a poorly formed mask with non-vertical sides. Moreover, the width of the final write pole cannot be accurately controlled or defined by such an under-layer.

Thus, to obtain a high quality under-layer mask pole structure, it is desirable to control the quality of side wall profile of the dielectric hard mask, in addition to the CD uniformity of the hard mask and under-layer mask.

During processing, it may be desirable to determine whether the hard mask CD is within a specification. If it is, subsequent processing can continue; if not, then the wafer may be reworked in part to obtain a hard mask with an acceptable CD, as described in more detail below.

Figure 9:
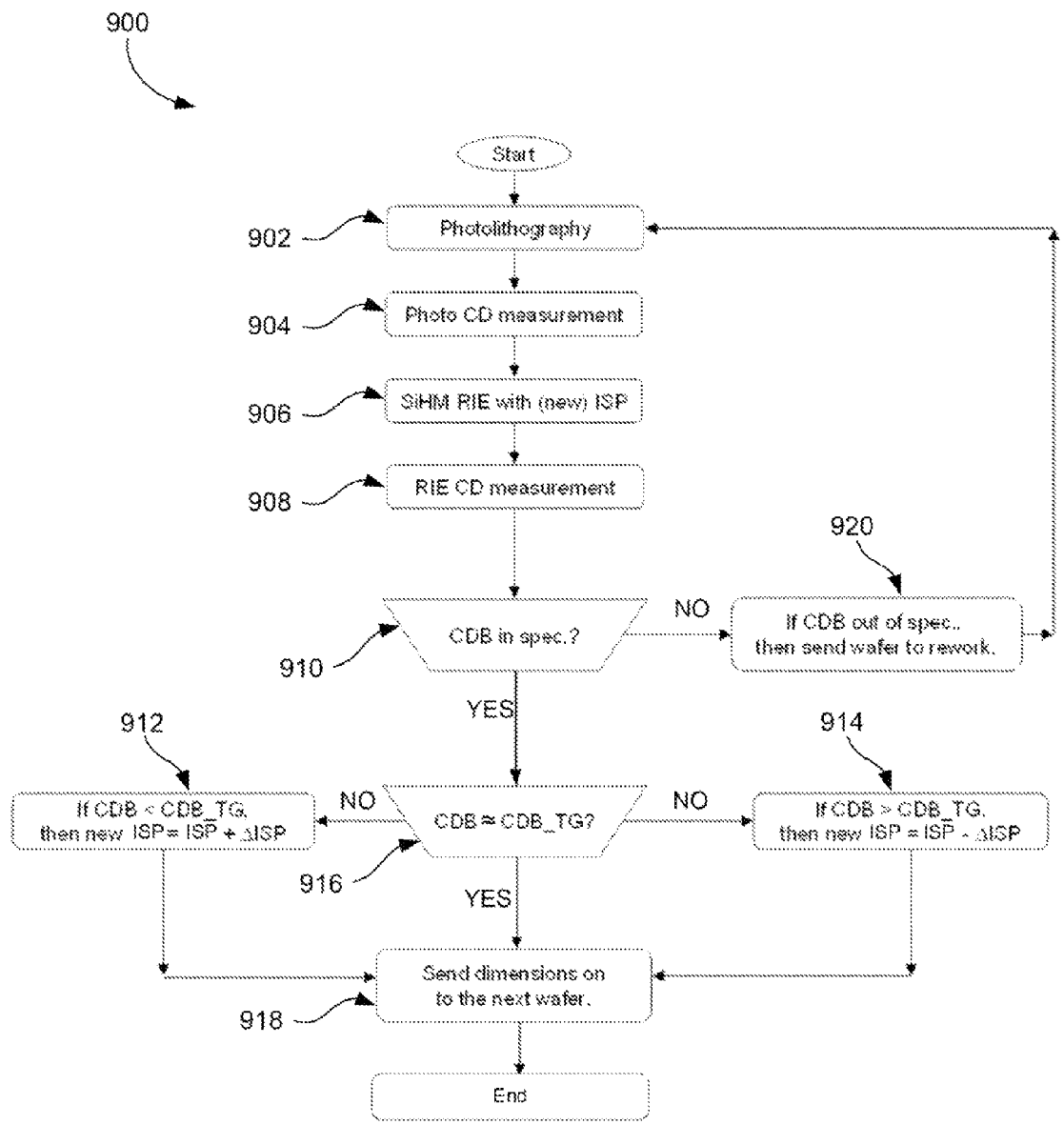
FIG. 9 is a flowchart of a method according to one embodiment.

A method 900 as depicted in FIG. 9 for manufacturing a magnetic write head according to any of the aforementioned embodiments may include any, some or all of the following steps, as well as any described above. The method 900 may incorporate features from any of the embodiments depicted in FIGS. 6A-6G, and preferably may include providing a wafer, depositing a magnetic write pole material on the wafer, depositing an ion milling hard mask on the magnetic write pole material, depositing a polymer mask under-layer over the ion milling hard mask, depositing a dielectric hard mask layer over the polymer mask under-layer, etc. Step 902 of method 900 includes forming a photoresist mask over the dielectric hard mask.

Step 904 may include conducting a photo CD measurement to determine whether the CD of the photoresist mask is within a specification. If it is, the process continues. If it is not, photoresist mask may be removed and re-applied.

Step 906 of method 900 includes transferring the image of the photoresist mask onto the hard mask layer using reactive ion etching.

Step 908 may include conducting a RIE CD measurement on the hard mask.

In a preferred embodiment, the target CD may correspond to a distance between the vertical sidewalls of the hard mask at the bottom of the hard mask after the reactive ion etching. In one approach of the preferred embodiment, determining that the CD of the hard mask 610 is within or outside the specification may include detecting a width of the hard mask 610 in a direction parallel to a plane of deposition thereof, and determining whether the width falls within a range specified by the specification, where the specification may be predetermined, selected by a designer, etc.

A conventional way to check if the side wall profile of the dielectric hard mask is vertical or not is to inspect the cross-sectional images using metrology tools such as FIB, STEM, etc. Such approach may be used in some approaches. However, this has proven to be very inconvenient, expensive and time consuming. Moreover, through further development, it has been found that the side wall profile of the dielectric hard mask is actually correlated with the CD bias (CDB), which is the difference between photo mask CD and post RIE CD (mathematically represented by CD bias=photo mask CD−post RIE hard mask CD). There is a certain range for the CD bias, in which the side wall profile of the dielectric hard mask is vertical enough to serve as a good mask for the under-layer RIE. However, if the CD bias is outside this range, the side wall profile is altered and results in either an undercut shape or a tapered shape as discussed above.

Use of a scanning electron microscope (SEM) is a very convenient and inexpensive technique to do many-point CD measurement in a very short time period. Therefore, the use of the CD measurement to judge if the side wall profile of the dielectric hard mask is vertical or not has great advantages over the conventional cross-sectional methods discussed above.

Step 910 includes determining that a CD bias of the hard mask is within a specification.

If step 910 results in a NO, then the wafer is sent to rework in step 920 whereupon the hard mask may be removed, and steps 902-910 are repeated with different RIE parameters in an attempt to obtain a hard mask CD bias within the specification.

Generally, the CD bias can be changed by tuning the RIE parameters such as gas flows, input RF power, chamber pressure, over etch time and etc. Through testing, it has been found that the combination of changing either the power and/or gas flows, both the post RIE CD and the CD bias can be adjusted. Since the side wall profile of the formed dielectric hard mask is correlated with the CD bias, therefore, the side wall profile can also be adjusted accordingly. Of course, the other parameters such as the etch rate of dielectric hard mask film will be changed corresponding to those made to the power and gas flows. However, because the endpoint is used to control the main etch time and the over etch amount is calculated based on the percentage of the endpoint time of main etch, the change of etch rate does not affect CD, CD bias or profile for a certain RIE process window.

Although both power and gas flows can be used for process control as described above, in practice, it is much more convenient to adjust the input power to achieve the goal, especially when using the advanced process control (APC) method to control the RIE tool parameters. This allows for a newly developed APC method to control the side wall profile of the formed dielectric hard mask through adjusting the input RF power of the RIE tools.

A level of an input source power (ISP) used during a subsequent reactive ion etching step may be changed, e.g., on the present wafer if being reworked, or on another wafer using an etch for transferring the image of a photoresist mask on the other wafer, to move the CD bias on this wafer or a subsequently-patterned wafer towards a target CD bias if the CD bias of the dielectric hard mask may be outside the specification.

Figure 8:
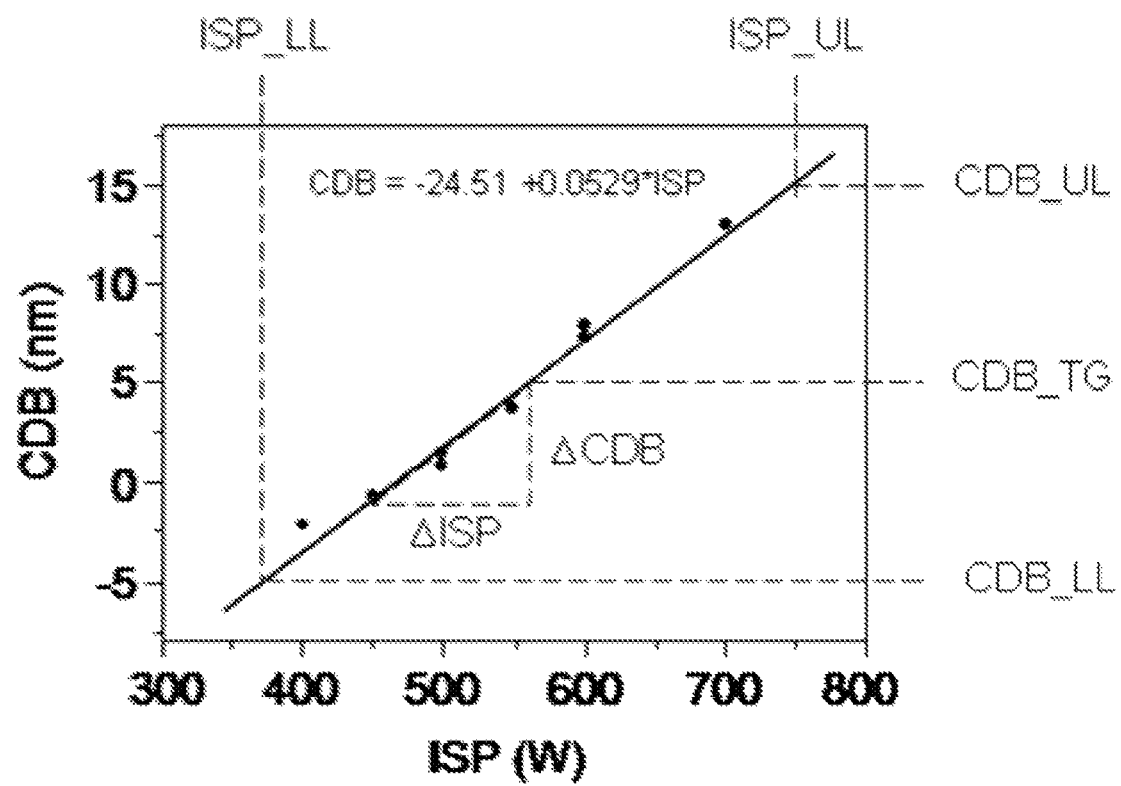
FIG. 8 is a graph displaying the relationship between the critical dimension bias (CDB) and input source power (ISP) according to one embodiment.

In one illustrative embodiment, the CD bias (CDB) of the dielectric hard mask has linear relation with input source power (ISP) for a fixed bias power, as depicted in FIG. 8. Moreover, the level of the input source power may be selected based on a linear equation, Equation 1:

$$CDB=CDB0+A*ISP \qquad \text{Equation 1}$$

at a fixed input bias power. According to the aforementioned linear equation, CDB preferably represents a CDB, and CDB0 preferably represents a constant signifying an intersection of a linear result (e.g., line on a chart) of the linear equation with the CDB axis. Furthermore, A preferably represents a slope of the linear result of the linear equation, and ISP preferably represents the input source power.

In production, the control of the profile of the dielectric hard mask can be realized by changing the CDB which is adjusted by tuning the input source power in a certain range. That is CDB_LL≤CDB≤CDB_UL while ISP_LL≤ISP≤ISP_UL, where CDB_LL is the lower limit of the CDB, and CDB_UL is the upper limit of the CDB, ISP_LL is the lower limit of the ISP, and ISP_UL is the upper limit of the ISP. When CDB_LL≤CDB≤CDB_UL, the formed dielectric hard mask has the profile that is vertical enough to serve as a desirable mask. When CDB<CDB_LL (or CDB>CDB_UL), the side wall profile of the dielectric hard mask may vary too much to function as a good mask. With the setting CDB_TG as CDB target at which the profile is mostly vertical, and CDB_LL and CDB_UL for the lower and upper limit of CDB, we have implemented Equation 1 into a APC system to control the CD bias of the dielectric hard mask and thus control its side wall profile through the adjusting the ISP in the range of ISP_LL≤ISP≤ISP_UP. One example is shown in FIG. 8, the CDB target is set as TGB=5 nm, the CDB lower limit is set as CDB_LL=−5 nm, and the CDB upper limit is set as CDB_UL=15 nm. Furthermore, the corresponding boundary limits for input source power are ISP_LL≈370 W, and ISP_UL≈750 W, respectively.

According to a tested illustrative embodiment, the APC tuning starts by probing send-ahead the wafer after each maintenance of the RIE tool to determine the initial value of the CDB for ISP~550 W. This value is relayed back to the APC control system, where a new value of the ISP is determined based on the Equation 1, if CDB<CDB_TG, or ΔCDB of ΔCDB=CDB−CDB_TG produces a negative value. Thereupon, a corresponding ΔISP is calculated and is added to the current input source power to be applied to the next wafer, thus bringing CDB towards the CDB_TG. In the event that CDB>CDB_TG, a corresponding ΔISP is still calculated and is subtracted from the current input source power, thus bringing CDB toward the CDB_TG again. The new ISP is calculated based on the CDB of the current wafer (e.g., single wafer, batch of wafers, etc.) and is applied to the RIE process of next wafer (e.g., single wafer, batch of wafers, etc.), and so on. In preferred embodiments, the value of ΔCDB should be less than about half of the CDB_UL–CDB_LL value, and greater than the about resolution of the CD SEM tool such as VeritySEM sold by Applied Materials Inc., but could be higher or lower based on the preferred design.

With continued reference to FIG. 9, if step 910 results in a YES, a determination is made as to whether a CDB has met a target (CDB_TG) in step 916, e.g., the CDB is about 0, indicating that the sidewalls are almost perfectly vertical. If step 916 results in a YES, the RIE parameters are used for processing of the next wafer using process 900. See step 918.

Moreover, if step 916 results in a NO, the process may proceed to either step 912 or 914, where the ISP parameter used in the hard mask RIE may be adjusted by adding or subtracting a correction (ΔISP), that is selected or a predetermined, value to or from the ISP to move the hard mask CDB towards the target (CDB_TG). Note that steps 912 and 914 are shown as being performed when the CDB of the hard mask is within the specification. In one approach, similar steps may be performed in conjunction with step 920.

Thereafter, the process may proceed to step 918. In another approach, the method described above, according to any embodiment, may be repeated on a second wafer using the changed input source power level.

Accordingly, as noted above, when the CD bias of the hard mask is inside the specification but away from the target CD bias, the level of the input source power used during a subsequent reactive ion etching step may be changed, e.g., on the present wafer if being reworked, or on another wafer using an etch for transferring the image of a photoresist mask on the other wafer. In yet another approach, the input source power may be increased when the CD bias is less than the target CD bias, and similarly the input source power may be decreased when the CD bias is greater than the target CD bias.

In an alternate embodiment, where the photoresist mask CD is strictly controlled, the specification of the CD of the photoresist mask is so narrow that the variation of the CD bias is mainly a factor of the RIE process. In this case, it is equivalent to set up a post RIE CD target and specification and use post RIE CD to do an APC control to obtain the correct CD bias and to control the hard mask profile. When the CD of the hard mask is inside the specification but away from the target, the level of the input source power used during a subsequent reactive ion etching step may be changed, e.g., on the present wafer if being reworked, or on another wafer using an etch for transferring the image of a photoresist mask on the other wafer. In yet another approach, the input source power may be decreased when the width is less than the target CD, and similarly the input source power may be increased when the width is greater than the target CD.

In a similar approach, the level of the input source power used during a subsequent reactive ion etching step on a second wafer may be changed when the CD of the hard mask may be outside the specification, or inside the specification but away from a target CD.

While various embodiments have been described, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method, comprising:
depositing a dielectric hard mask layer above a polymer mask under-layer;
forming a photoresist mask above the hard mask layer;
transferring the image of the photoresist mask onto the hard mask layer using reactive ion etching, thereby defining a hard mask;
determining that a critical dimension bias of the hard mask is within or outside a specification; and
changing a level of an input source power used during a subsequent reactive ion etching step to move the critical dimension bias towards a target critical dimension bias when the critical dimension bias of the hard mask is outside the specification.

2. The method as recited in claim 1, wherein the level of the input source power is selected based on a linear equation CDB=CDB0+A*ISP at a fixed input bias power, where CDB is a critical dimension bias, CDB0 is a constant representing an intersection of a linear result of the linear equation with the CDB axis, A is a slope of the linear result of the linear equation, and ISP is the input source power.

3. The method as recited in claim 1, further comprising changing the level of the input source power used during a subsequent reactive ion etching step when the critical dimension bias of the hard mask is inside the specification but away from the target critical dimension bias.

4. The method as recited in claim 1, wherein the target critical dimension bias corresponds to vertical sidewalls of the hard mask after the reactive ion etching.

5. The method as recited in claim 1, wherein determining that the critical dimension bias of the hard mask is within or outside the specification includes detecting a critical dimension of the photoresist mask and critical dimension of the hard mask in a direction parallel to a plane of deposition of the hard mask layer, calculating the critical dimension bias using the detected photoresist mask critical dimension and the detected hard mask critical dimension, and determining whether the critical dimension bias falls within a range specified by the specification.

6. The method as recited in claim 5, wherein the input source power is increased when the critical dimension bias is less than the target critical dimension bias.

7. The method as recited in claim 5, wherein the input source power is decreased when the critical dimension bias is greater than the target critical dimension bias.

8. The method as recited in claim 1, further comprising transferring an image of the hard mask onto the underlayer using a second reactive ion etching having a different material selectivity than the reactive ion etching after determining that the critical dimension bias of the hard mask is within the specification.

9. The method as recited in claim 8, wherein the polymer mask underlayer overlies a magnetic write pole material, further comprising, after performing the second reactive ion etching, performing an ion milling to transfer the image of the under-layer onto the magnetic write pole material, thereby defining a magnetic write pole.

10. The method as recited in claim 1, further comprising repeating the: depositing the dielectric hard mask layer, forming the photoresist mask, and transferring the image when the critical dimension bias of the hard mask is outside the specification and using the changed level of the input source power.

11. The method as recited in claim 1, further comprising repeating the method on a second wafer using the changed input source power level.

12. A method for manufacturing a magnetic write head, the method comprising:
providing a wafer;
depositing a magnetic write pole material on the wafer;
depositing an etch stop layer above the magnetic write pole material;
depositing a polymer mask under-layer above the etch stop layer;
depositing a dielectric hard mask layer above the under-layer;
forming a photoresist mask over the dielectric hard mask layer;
transferring the image of the photoresist mask onto the hard mask layer using reactive ion etching, thereby defining a hard mask;
determining that a critical dimension bias of the hard mask is within or outside a specification;
performing subsequent processing on the wafer when the critical dimension bias of the hard mask is within the specification; and
removing the hard mask when the critical dimension bias of the hard mask is outside the specification and repeating the forming the photoresist mask and the transferring using a different level of an input source power for the reactive ion etching, the different level being selected based on the determining.

13. The method as recited in claim 12, wherein the level of the input source power is selected based on a linear equation CDB=CDB0+A*ISP at a fixed input bias power, where CDB is a critical dimension bias, CDB0 is a constant representing an intersection of a linear result (e.g., line on a chart) of the linear equation with the CDB axis, A is a slope of the linear result of the linear equation, and ISP is the input source power.

14. The method as recited in claim 12, further comprising changing the level of the input source power used during a subsequent reactive ion etching step on a second wafer when the critical dimension bias of the hard mask is outside the specification, or inside the specification but away from a target critical dimension bias.

15. The method as recited in claim 14, wherein the target critical dimension bias corresponds to vertical sidewalls of the hard mask after the reactive ion etching.

16. The method as recited in claim 12, wherein determining that the critical dimension bias of the hard mask is within or outside the specification includes detecting a critical dimension of the hard mask in a direction parallel to a plane of deposition thereof, detecting a critical dimension of the photoresist mask in a direction parallel to a plane of deposition thereof, calculating the critical dimension bias of the hard mask using the detected critical dimensions of the photoresist mask and photoresist mask, and determining whether the critical dimension bias falls within a range specified by the specification.

17. The method as recited in claim 16, wherein the input source power is increased when the critical dimension bias is less than the target critical dimension bias.

18. The method as recited in claim 16, wherein the input source power is decreased when the critical dimension bias is greater than the target critical dimension bias.

19. The method as recited in claim 12, further comprising transferring an image of the hard mask onto the underlayer using a second reactive ion etching having a different material selectivity than the reactive ion etching after determining that the critical dimension bias of the hard mask is within the specification.

20. The method as recited in claim 19, further comprising, after performing the second reactive ion etching, performing an ion milling to transfer the image of the under-layer onto the magnetic write pole material, thereby defining a magnetic write pole.

* * * * *